METHOD OF MAKING PRINTED CIRCUITS

Filed June 12, 1957 6 Sheets-Sheet 1

PREPARATION OF CARRIER PLATE FOR SUPPORTING A PRINTED CIRCUIT PATTERN.

APPLYING A PHOTORESIST COATING.

EXPOSE

DELINEATING CIRCUIT PATTERN

ELECTROPLATING RHODIUM COATINGS ON THE CARRIER PLATE

INVENTORS N. OSIFCHIN
E. E. WRIGHT
BY B. T. Stoddard
ATTORNEY

METHOD OF MAKING PRINTED CIRCUITS

Filed June 12, 1957 6 Sheets-Sheet 2

FIG. 1f

ELECTROPLATING A BACKING PLATE TO THE RHODIUM PLATING.

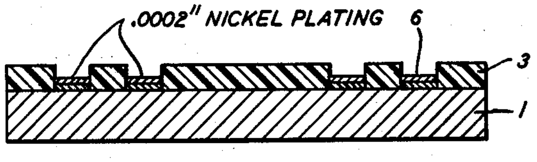

FIG. 1g

ELECTROPLATING A SECOND BACKING MEMBER.

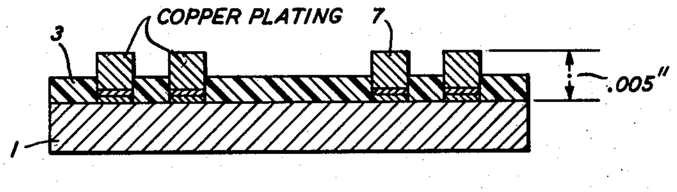

FIG. 1h

REMOVING THE PHOTO-RESIST MATERIAL.

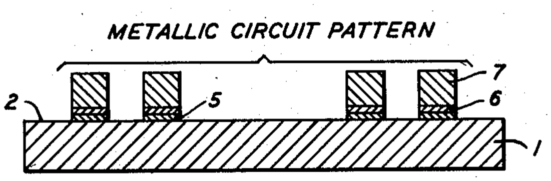

FIG. 1j

APPLYING ADHESIVE TO THE CIRCUIT PATTERN.

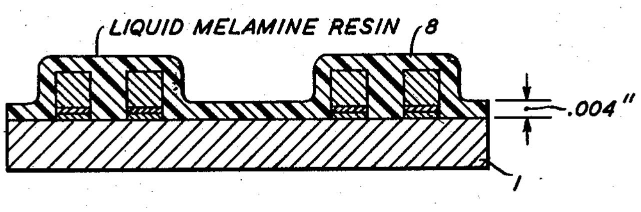

FIG. 1k

APPLYING AN INSULATING BASE OF PHENOLIC RESIN INPREGNATED PAPER OVER THE CIRCUIT PATTERN.

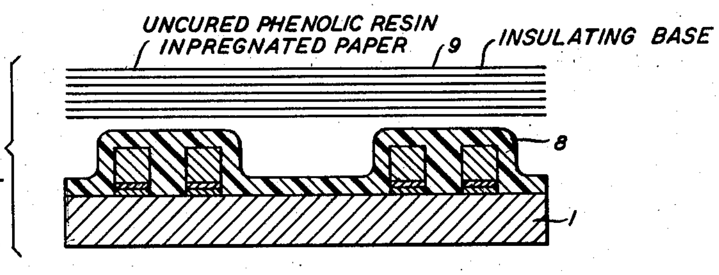

INVENTORS N. OSIFCHIN
E. E. WRIGHT
BY B. H. Stoddard
ATTORNEY

METHOD OF MAKING PRINTED CIRCUITS

Filed June 12, 1957 6 Sheets-Sheet 3

APPLYING ADHESIVE TO THE PHENOLIC RESIN IMPREGNATED PAPER.

APPLY A BACKING PLATE TO THE INSULATING BASE.

MOLDING THE INSULATING BASE TO THE CARRIER PLATE.

REMOVING CARRIER PLATE FROM CIRCUIT PATTERN AND INSULATING BASE.

INVENTORS N. OSIFCHIN
E. E. WRIGHT
BY [signature]
ATTORNEY

APPLYING A POLY-VINYL BUTYRAL-PHENOLIC RESIN TO THE CIRCUIT PATTERN

APPLYING INSULATING BASE OF UNCURED MELAMINE RESIN INPREGNATED PAPER TO THE CIRCUIT PATTERN.

N. OSIFCHIN
E. E. WRIGHT
B. H. Stoddard

METHOD OF MAKING PRINTED CIRCUITS

Filed June 12, 1957 6 Sheets-Sheet 5

INVENTORS N. OSIFCHIN E. E. WRIGHT

BY F. J. Stoddard

ATTORNEY

METHOD OF MAKING PRINTED CIRCUITS

Filed June 12, 1957 6 Sheets-Sheet 6

FIG. 4a

APPLYING AN ACID-SOLUBLE COATING TO CARRIER PLATE AND CONDUCTIVE PATTERN.

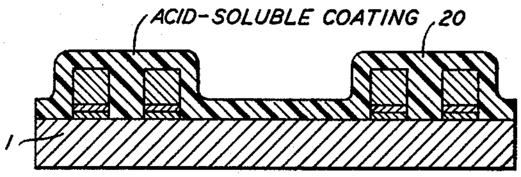

FIG. 4b

MASKING CIRCUIT PATTERN AREA

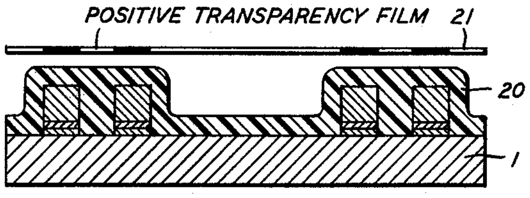

FIG. 4c

REMOVING COATING FROM COPPER BACKING PLATE.

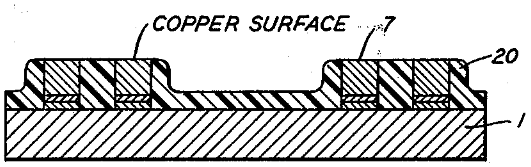

FIG. 4d

APPLYING ADHESIVE TO ONLY THE COPPER BACKING PLATE.

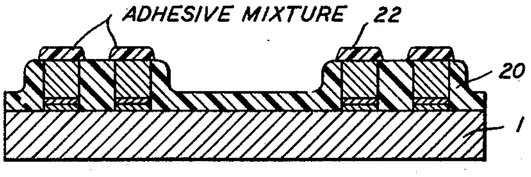

FIG. 4e

REMOVING ACID-SOLUBLE COATING TO LEAVE ADHESIVE ONLY ON THE COPPER BACKING PLATE.

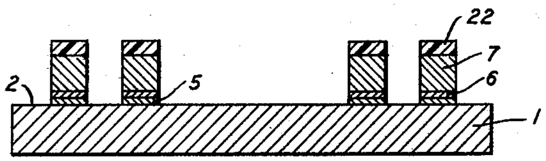

INVENTORS N. OSIFCHIN
E. E. WRIGHT

BY [signature] Stoddard

ATTORNEY

United States Patent Office 3,152,938
Patented Oct. 13, 1964

3,152,938

METHOD OF MAKING PRINTED CIRCUITS

Nicholas Osifchin, Clifton, and Edgar E. Wright, Fanwood, N.J., assignors, by mesne assignments, to the United States of America as represented by the Secretary of the Army Filed June 12, 1957, Ser. No. 665,170
3 Claims. (Cl. 156—3)

Figure 1A:
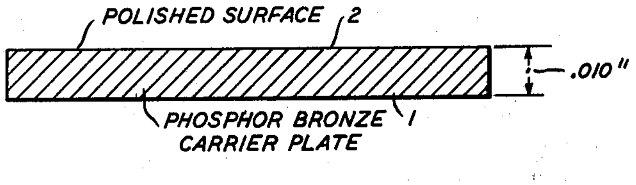
Figure 1B:
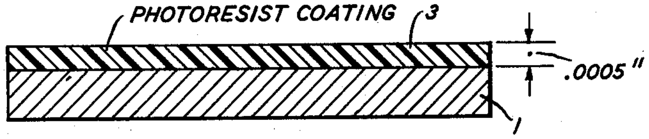
Figure 1C:
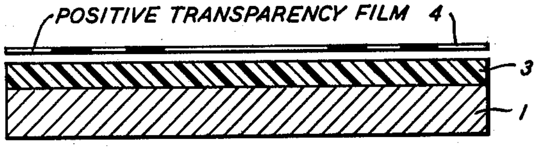
Figure 1D:
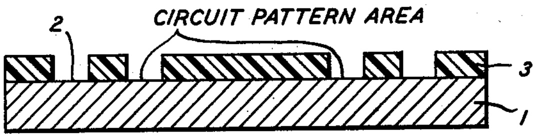
Figure 1E:
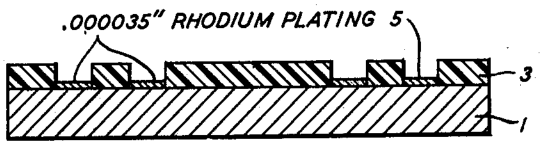
Figure 1L:
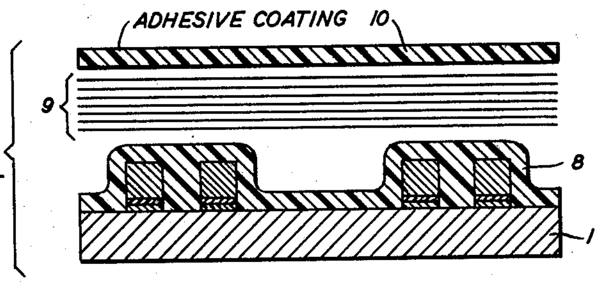
Figure 1M:
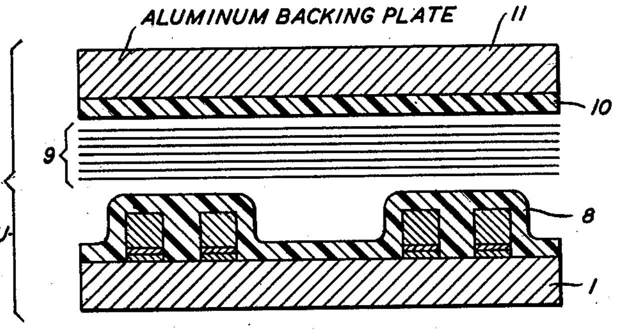
Figure 1N:
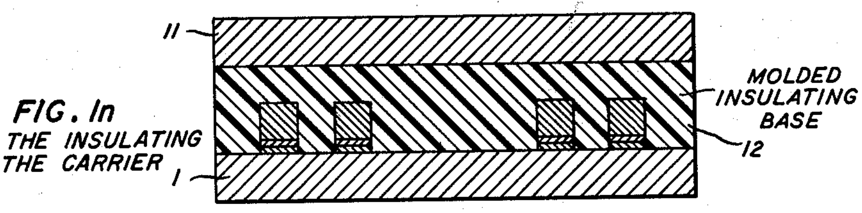
Figure 1P:
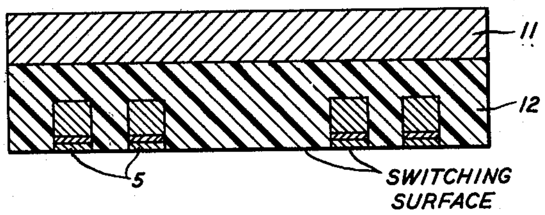

This invention relates to printed electric circuits and, more particularly, to an improved process for fabricating a printed electric circuit having circuit elements which are embedded in an insulating base in such a manner that the surfaces of the circuit elements are in precisely the same plane as the surface of the insulating base.

This invention is especially useful when it is applied to the fabrication of switch plates used in high-speed rotary switches or commutators in various types of equipments, such as electronic computers, data processing systems, or telephone step-by-step mechanisms. It can be understood that, when it is desired to operate a rotary switch and brush assembly at a high linear speed, such as 720 feet per minute, consideration must be given to such limiting factors as the flatness and finish of the switching surface which is in contact with the brush. Any irregularities or abrupt interruptions in the surface of the switch plate may cause the brush to bounce. This is objectionable for three reasons; namely, it limits the maximum operating speed, it produces excessive wear of both the brush and the switch plate, and it impairs the reliability of the switching operations due to the hazard of the brush skipping over some of the switching contacts.

In order to avoid these objections, it is desirable that switch plates of the type mentioned above be fabricated in such a manner that their electrically conductive surfaces are precisely flush with the surfaces of their insulating bases. In addition to possessing high wear-resistance and extreme smoothness and flatness, the conductive surfaces should have sharp definition at their points of demarcation. It is desirable that the insulating base material be capable of resisting smudging or mechanical tracking, possess good wear-resistance, high insulation-resistance, and have good arc-resistant properties. Another important requirement is that all of the portions of each conductive circuit pattern should be firmly embedded in their insulating base in such a manner as to give them high peel-strength so that they will not be lifted by long-term aging nor be raised during long periods of high-speed wiping. In order to fulfill this last requirement, the conductive elements of a circuit pattern should be securely bonded to their insulating base for the purpose of insuring that their switching surfaces will always remain flush with the surface of their insulating base.

Accordingly, it is an object of this invention to produce an improved printed electric circuit having the surface of its electrically conductive circuit pattern precisely flush with the surface of its insulating base.

It is also an object of this invention to provide an improved process for fabricating flush-mounted printed electric circuits.

Another object of this invention is to provide an improved method for securely bonding the conductive elements of a printed circuit to their insulating base.

These and other objects of the invention are attained through the use of a method which, in its preferred embodiment, generically comprising coating a polished plane surface of a metallic carrier plate with a suitable acid-resistant photosensitive material, photographically printing a desired circuit pattern upon the photoresist coating, removing those portions of the photoresist coating which correspond to the circuit pattern so as to uncover corresponding portions of the polished surface of the carrier plate, forming an electrically conductive metallic circuit pattern upon the carrier plate by electroplating a coating of a hard wearing metal such as rhodium on the uncovered portions of the surface of the carrier plate, backing this metal coating with successive platings of nickel and copper, removing the remaining portions of the photoresist coating from the surface of the carrier plate, applying an adhesive to the electroplated circuit pattern, molding a laminate of suitable resin-impregnated paper to the adhesive-covered metallic circuit pattern and to the carrier plate, and then removing the carrier plate.

In one fabrication process employing the principles of this invention, the adhesive which is used for bonding the metallic circuit pattern to the paper laminate is a liquid melamine resin. In this form of the invention, the adhesive is applied not only to the electroplated circuit pattern but also to the polished surface of the carrier plate. The final step of removing the carrier plate is accomplished by dissolving it in a solution of chromic and sulphuric acids as is more fully explained hereinafter.

In an alternative manufacturing process in accordance with this invention, the insulating base is formed from a pile-up composed of melamine-resin impregnated paper and phenolic-resin impregnated paper. During the molding process, the paper laminate is bonded to the metallic circuit pattern by means of a suitable bonding agent selected from the class of adhesives which comprises mixtures of phenolic resin and polyvinyl butyral resin. This bonding agent, as in the first process mentioned above, is applied to both the electroplated circuit pattern and to the polished surface of the carrier plate.

Another alternative fabricating process following the teachings of this invention restricts the application of the adhesive to only the surface of the electroplated metallic circuit pattern. In accordance with this method, the adhesive is confined precisely to only the area of the circuit pattern by means of a suitable acid-soluble masking coating which is preferably formed upon the other portions of the carrier plate by a photographic printing process. After the adhesive has been applied only to the circuit pattern, the masking coating is removed by dissolving it in a suitable acid solution, such as acetic acid, thereby leaving the polished surface of the carrier plate clean and free of any adhesive material.

These and other features of this invention are more fully discussed in connection with the following detailed description of the drawings in which:

FIGS. 1 to 14, inclusive, are enlarged cross-sectional views illustrating diagrammatically the steps followed in fabricating a flush-mounted printed electric circuit in accordance with the first process mentioned above;

FIG. 15 is a view of the switching surface of a commutator switch plate constructed by the method of this invention;

FIGS. 16 to 21, inclusive, are enlarged cross-sectional views representing diagrammatically steps followed in manufacturing a flush-mounted printed circuit in accordance with the second process mentioned above; and FIGS. 22 to 26, inclusive, are enlarged cross-sectional views showing some of the steps of the above-mentioned third process for making flush-mounted printed circuits.

The first step in the process of fabricating flush-mounted printed circuits, such as commutator switch plates, in accordance with this invention is to prepare a metallic carrier or transfer plate for supporting the printed circuit pattern during the various steps of the manufacturing process. The requirements for the metal from which this carrier plate should be made are that it be sufficiently rigid to maintain a plane surface, be capable of taking a high polish, and be soluble in an etching solution that will not attach rhodium or nickel. These requirements can be met by using a carrier plate composed of hard-drawn Phosphor bronze having a thickness of about .010 inch. This carrier plate should be prepared in a manner now to be described.

The Phosphor bronze carrier plate 1 is first carefully polished on one side 2 as is indicated in FIG. 1 so as to provide a highly polished plane surface. This is important because the surface 2 acts as a platen during a subsequent operation of forming thereon the flush-mounted switching surface of a commutator switch plate as is described hereinafter. Therefore, the smoothness and flatness of the switching surface of the completed switch plate depend upon the quality of the finish of the surface 2. It is for this reason that hard-drawn Phosphor bronze is a preferred metal for this purpose since, as was stated above, it is capable of taking a high polish and has sufficient rigidity for maintaining a plane surface.

After the polishing operation has been performed, the polishing compounds are removed through the use of suitable solvents. The carrier plate 1 is now de-greased by immersing it in a cathodic electrolytic cleaner after which it is rinsed in hot and cold water. It is next immersed for about fifteen seconds in ten percent hydrochloric acid, rinsed in cold water, and then blown dry with clean air.

Figure 2:
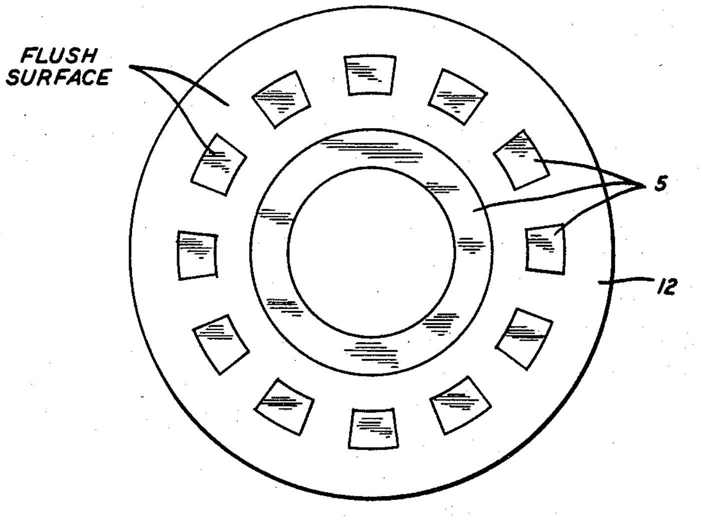

The next step is to prepare the clean, polished surface 2 of the carrier plate 1 for the plating of a circuit pattern thereon during a subsequent operation. Accordingly, the surface 2 is now covered with two sprayed coatings 3 of a suitable photosensitive, acid-resistant material commonly known to those skilled in the art as photoresist. Each of these two coatings 3 should be baked for approximately twenty minutes at 150 degrees Fahrenheit in a dark, dust-free oven. The total thickness of the two coatings of photoresist 3 is of the order of .0005 inch as is indicated in FIG. 2.

Figure 3A:
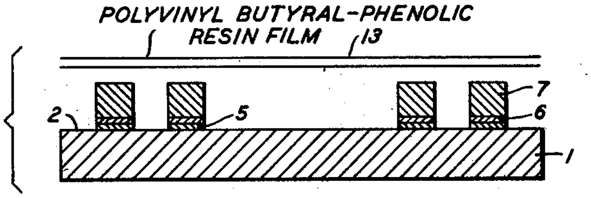
Figure 3B:
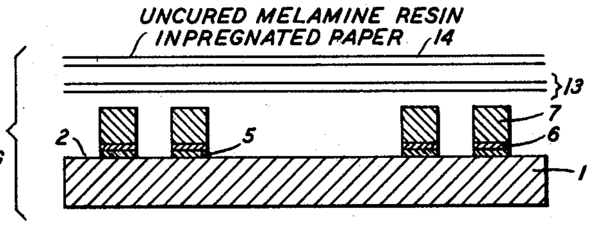
Figures 3C, 3D, 3E, 3F:
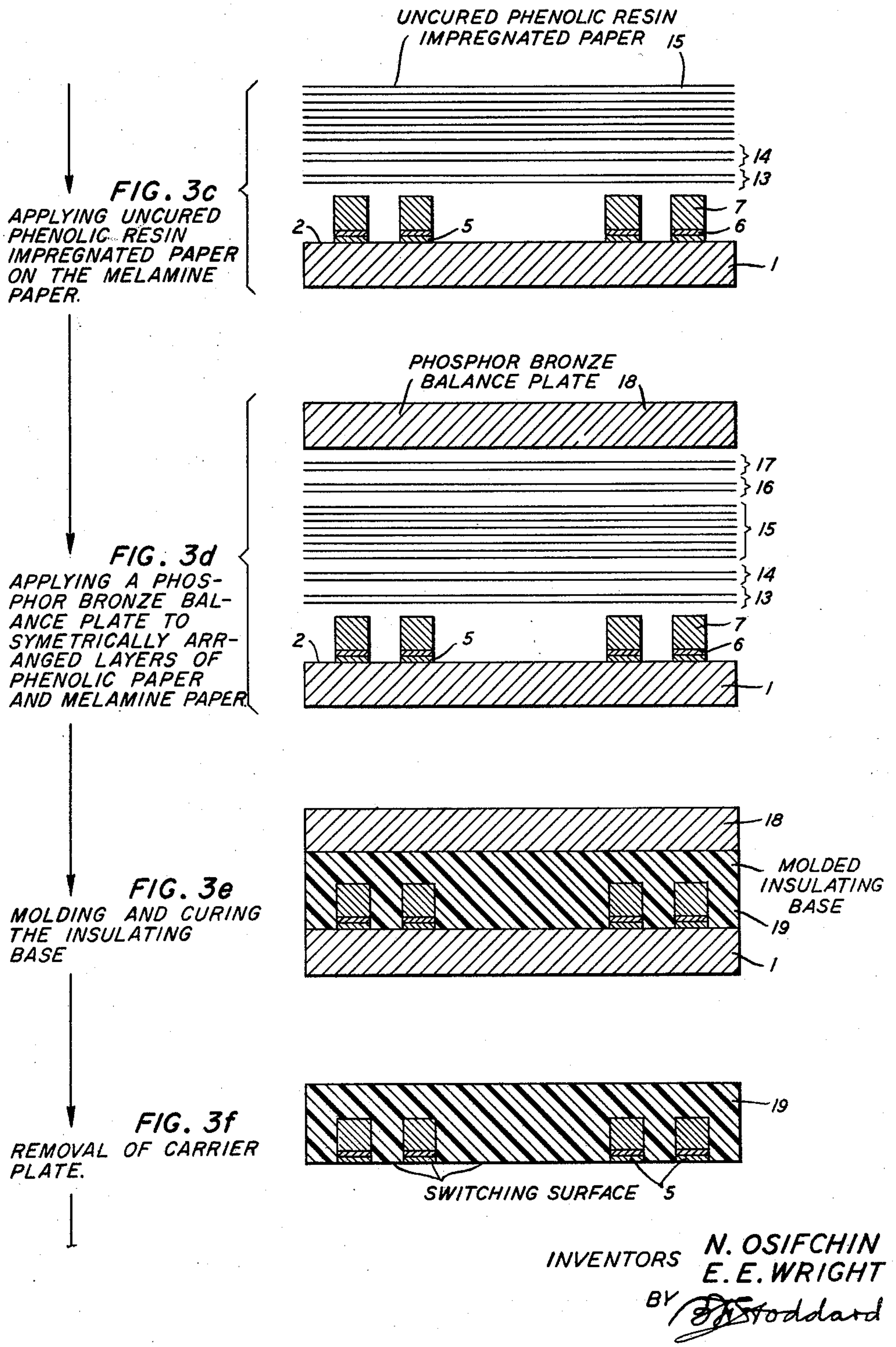

In order to print photographically a circuit pattern upon the surface of the photoresist 3, a positive transparency film 4 of the desired electric circuit pattern is superimposed, as is shown in FIG. 3, upon the coated carrier plate 1 which is now exposed to an arc light for about fifteen minutes. After this exposure, the positive transparency film 4 is removed and the carrier plate 1 is placed in a photo-developing solution for about seven minutes. This removes only those portions of the photoresist 3 that where shielded from the arc light by the positive circuit pattern on the film 4, thereby uncovering corresponding portions of the polished surface 2 of the carrier plate 1 so that the circuit pattern becomes portrayed thereon as is represented in FIG. 4. Since the other portions of the photoresist 3 that were exposed to the light are left still adhering to the surface 2, they form a masking covering around the area of the circuit pattern as can be seen in FIG. 4. The carrier plate 1 is next rinsed in warm water to remove the photo-developing solution and is then dried with an air blast. Care should be used to keep the uncovered Phosphor bronze surface 2 clean and free of finger prints.

For the purpose of fulfilling strict requirements as to exactness, the carrier plate 1 can now, if desired, be immersed in a suitable dye, such as an organic compound, for an appropriate length of time. The dye will color the masking portions of the photoresist 3 remaining on the surface 2 of the carrier plate 1 but will not act upon the uncovered portions of the Phosphor bonze surface 2. This facilitates inspection of the photoresist coating 3 for the purpose of determining whether there are any imperfections in the printed circuit pattern. If any such imperfections are discovered, they can be corrected by retouching them with an acid-resistant lacquer.

The carrier plate 1 with the desired circuit pattern area delineated thereon by the photographically exposed masking portions of the photoresist 3 should now be prepared for an electroplating operation by having an electrically conductive wire soldered to one of its corners. The edges and the reverse side of the carrier plate 1 should be covered with a suitable protective masking material such as tape, so that no metallic electro-deposit will be formed upon these surfaces during the electroplating operation. As these are well known expedients in the electroplating art, the wire and protective tape have not been shown in the drawing for purposes of simplicity.

The circuit pattern area of the Phosphor bronze surface 2 is now scrubbed with Vienna lime in order to remove all grease, oil, and finger prints as this is the area which is to be electroplated. Next, the carrier plate 1 is rinsed in cold water and is then immersed for about thirty seconds in ten percent hydrochloric acid after which it is again rinsed in cold water. The carrier plate 1 is now ready to have a metallic coating electroplated immediately upon the circuit pattern area.

Since this metallic plating will ultimately form the switching surface of the completed commutator switch plate, a preferred metal for this purpose is rhodium as it is capable of providing a hard, wear-resistant, non-smearing surface for use with the brush of a commutator. Due to its high cost, the rhodium is applied as a thin electro-deposit 5, which, as is represented in FIG. 5, has a thickness of about .000035 inch. As can be seen in FIG. 5, the portions of the photoresist coating 3 that remain on the carrier plate 1 serve as a masking covering to confine the rhodium plating 5 to only the area of the circuit pattern and provide sharp definition at the points of demarcation.

Next, the plating 5 of rhodium is backed by an electro-deposit 6 of about .0002 inch of nickel as is indicated in FIG. 6. Nickel is selected for this purpose because it provides a hard backing material for the rhodium plating 5 and it is not soluble in the etching solution of chromic and sulphuric acids which is used during a later step in this process as is described hereinafter.

For the purpose of obtaining good electric conductivity, the plating 6 of nickel is backed with an electro-deposit 7 of several thousands of an inch of copper with the result that the total thickness of the combined deposits of the metallic platings 5, 6, and 7 will be about .005 inch as is indicated in FIG. 7. It is to be noted that if the thickness of the metallic deposits exceeds this amount, there will be a tendency during the electroplating operation for them to creep excessively over the surface of the photoresist 3 which only has a thickness of approximately .0005 inch. Therefore, care should be used to prevent the thickness of the metallic deposits from becoming greater than about .005 inch.

After the electroplating operations have been completed, the carrier plate 1 is lifted out of the plating bath, is rinsed in cold water, and is then dried. The photoresist 3 is now removed by immersing the carrier plate 1 in a suitable solvent, such as ethylacetate, and by scrubbing it gently with a soft brush. After the photoresist 3 has been completely removed, the carrier plate 1 is rinsed in cold water, de-greased in an electrolytic cleaner, rinsed in hot water, rinsed in cold water, immersed for thirty seconds in ten percent hydrochloric acid, rinsed in cold water, and finally dried with a blast of clean air. The carrier plate 1 and the metallic circuit pattern electroplated thereon now appear in the form shown in FIG. 8.

The next step in the manufacturing process of this invention is to apply a suitable adhesive to the metallic circuit pattern for use during a subsequent operation of securely bonding the metallic circuit pattern to its insulating base so as to insure that the switching surface of the metallic circuit pattern will always remain flush with the surface of the insulating base. One material that can be used for this purpose is liquid melamine resin which will be cured during a subsequent operation as is described hereinafter. In addition to its bonding function, this material has the additionally advantageous property, after it has been cured, of providing a hard, long-wearing, smudge-resistant, non-smearing arc-resistant, insulating surface. Therefore, because of these qualities, it is a desirable material to be used for forming the surface of the insulating base. Accordingly, a coating 8 of liquid melamine resin having a thickness of about .004 inch, as is indicated in FIG. 9, is applied in any suitable manner known to those skilled in the art to both the polished surface 2 of the carrier plate 1 and also to the metallic circuit pattern electroplated thereon. In order to prevent the liquid melamine resin 8 from flowing off the surface 2 of the carrier plate 1, it should be confined by a suitable mold in a manner well known to those skilled in the art. The advantage of using an adhesive that is in the form of a liquid is that it serves to fill completely all the voids in the circuit pattern during the subsequent molding operation.

An insulating base is now molded over the adhesive-coated metallic circuit pattern. This operation is performed by placing a number of sheets of uncured phenolic resin-impregnated paper stock 9 over the melamine coating 8 as is represented in FIG. 10. The strength and rigidity of the final form of the insulating base can be increased by arranging the individual sheets of phenolic paper 9 in such a manner that the orientation of the grain of one sheet is in a direction ninety degrees removed from the direction in which the grain of the adjacent sheets is oriented. A convenient way of accomplishing this is to provide each sheet with an identifying mark, such as a notch or a colored stripe, for indicating the orientation of its grain and then to arrange the sheets so that the marks are disposed in an alternate manner.

The rigidity of the final form of the switch plate can be further improved by employing a backing plate of some suitable metal, such as aluminum. In order to secure this backing plate to the insulating base, the top surface of the phenolic paper pile-up 9 should first be covered with a coating 10 of an appropriate adhesive as is shown in FIG. 11. When this has been done, the backing plate 11 is laid on top of the adhesive coating 10 as is indicated in FIG. 12.

This assembly is now molded and cured in a press at about 325 degrees Fahrenheit under a pressure of about 1,500 pounds per square inch for approximately thirty minutes. It is then allowed to cool to room temperature while remaining under pressure. During this operation, both the liquid melamine resin 8 and the phenolic resin-impregnated paper 9 become transformed into a hard, solid, insulating base 12 as is shown in FIG. 13.

The final step in this manufacturing process is to remove the carrier plate 1 from the remainder of the assembly so as to expose the switching surface of the metallic circuit pattern which is now securely bonded to the cured melamine-phenolic base 12. This can be accomplished conveniently by placing the entire assembly in a suitable etching bath, such as a solution of chromic and sulphuric acids at about 120 degrees Fahrenheit. The acid solution will dissolve the Phosphor bronze carrier plate 1 in about fifty minutes during which time it is preferable that the solution be stirred. This solution will not attack the melamine-phenol base 12, the aluminum backing plate 11, the rhodium plating 5, or the nickel plating 6. Although the copper plating 7 would be soluble in this acid solution, it is completely protected therefrom by the surrounding base 12 and the rhodium and nickel platings 5 and 6. As soon as the carrier plate 1 is completely dissolved, the assembly is removed from the acid solution and is rinsed in cold, running water for two hours. It is then dried in an oven at about 130 degrees Fahrenheit for several hours, after which it may be machined or polished as desired.

The completed commutator switch plate will now appear in the form shown in FIG. 14 with the surfaces of the rhodium platings 5 on the segments of the metallic circuit pattern lying in precisely the same plane as the surface of the insulating base 12. A view of the switching surface of this completed commutator switch plate is shown in FIG. 15.

As was stated above, an alternative process for fabricating flush-mounted printed circuits in accordance with this invention employs a different adhesive for bonding the metallic circuit pattern to the insulating base. This second process in its preferred embodiment follows the above-described steps of preparing the carrier plate 1, applying the photoresist coating 3, developing thereon the desired circuit pattern, applying successive electroplatings of rhodium 5 backed with nickel 6 followed by copper 7, and then removing the remaining portions of the photoresist coating 3 with the result that the carrier plate 1 and the metallic circuit pattern electroplated thereon appear in the form illustrated in FIG. 8.

Now, instead of applying liquid melamine resin, this second process substitutes therefor a suitable bonding agent selected from the class of adhesives which comprises mixtures of phenolic resin and polyvinyl butyral resin. A thin layer 13 of this adhesive mixture, which may be in the form of sheet-film, is applied over both the polished surface 2 of the carrier plate 1 and the metallic circuit pattern as is indicated in FIG. 16. The advantage of using an adhesive that is in the form of sheet-film is that it serves to insure that the adhesive material will be evenly distributed over the underlying metallic surfaces.

Since the adhesive mixture 13 acts primarily as a bonding agent, the next step in this second process is to supply some form of melamine resin which can be used to make the desired long-wearing, arc-resistant, insulating surface of the completed switch plate. This can be done conveniently by superimposing a suitable number of sheets of uncured melamine resin impregnated paper 14 over the adhesive coating 13 as is shown in FIG. 17. The individual sheets of melamine paper 14 should be arranged in a cross-grained manner as was described above with respect to the pile-up of phenolic resin impregnated paper 9.

In order to obtain a base having good insulating properties, a cross-grained pile-up of uncured phenolic resin impregnated paper 15 is laid on top of the pile-up of melamine paper 14 as is represented in FIG. 18. It should be noted that the phenolic paper pile-up 15 is considerably thicker than the melamine paper pile-up 14.

If desired, an adhesive-coated backing plate may be superimposed over the phenolic paper pile-up 15 as was explained above with respect to the steps illustrated in FIGS. 11 and 12. An alternative procedure is to construct a symmetrical assembly by superimposing upon the pile-up 15 of phenolic paper a second pile-up 16 of melamine paper equal in thickness to the first melamine paper pile-up 14. This should be followed by a layer 17 of the adhesive film having the same thickness as the first adhesive layer 13. Finally, the adhesive layer 17 is covered with a Phosphor bronze balance plate 18 having the same dimensions as the carrier plate 1. It should be noted that the resulting assembly, which is shown in FIG. 19, is symmetrical with respect to a plane passing through the middle of the pile-up 15 of phenolic resin-impregnated paper.

The assembly shown in FIG. 19 is now molded and cured in a press in a manner similar to that described above. During this operation, the polyvinyl butyral-phenolic adhesive mixture 13 will blend with the melamine paper 14 so as not only to provide a secure bond between the metallic circuit pattern and the melamine paper 14, but also to provide a satisfactorily hard-wearing, arc-resistant, working surface for the switch plate. At the conclusion of this operation, the assembly will appear in the form represented in FIG. 20 in which it can be seen that the insulating base 19 is constituted by the above-mentioned resin materials which have been transformed into a hard, solid mass. It should be noted that, since the materials used in this assembly have different thermal coefficients of expansion, planar distortion of the final product can be avoided by allowing the molded assembly to cool slowly while remaining under pressure in order to permit adjustment of any internal forces. Another factor in avoiding planar distortion is that the symmetrical assembly, described above with respect to FIG. 19, serves to balance any internal forces that may be caused by the different thermal coefficients of expansion of the materials in this assembly.

The final step in this second process is the removal of the carrier plate 1 and the balance plate 18. This can be accomplished conveniently by dissolving them in a solution of chromic and sulphuric acids in the manner described above. After this operation has been completed, the commutator switch plate will appear in its final form as is shown in FIG. 21 with the insulating portions 19 and the metallic portions 5 of its switching surface precisely flush with respect to each other.

Another alternative process for fabricating flush-mounted printed circuits in accordance with this invention differs from the two processes described above in that the adhesive which is used for bonding the metallic circuit pattern to the insulating base is not applied to the surface 2 of the carrier plate 1 but is applied only to the top of the copper plating 7 of the metallic circuit pattern. This third process follows the steps that were described above with respect to electroplating the metallic circuit pattern upon the carrier plate 1, removing the acid-resistant coating 3, and cleaning the surface 2 of the carrier plate 1 and the metallic circuit pattern so that they appear in the form shown in FIG. 8.

A preferred method of efficiently and precisely applying the adhesive to only the top surface of the metallic circuit pattern without leaving any of the adhesive on the polished surface 2 of the carrier plate 1 will now be described. In accordance with this method, a photosensitive, acid-soluble coating 20 is applied in any convenient manner, such as by spinning, to the assembly of FIG. 8 so as to cover both the surface 2 of the carrier plate 1 and the metallic circuit pattern as is indicated in FIG. 22. The coating 20 may be of any suitable material, such as a mixture of glue and egg albumen with a small amount of ammonium dichromate.

After the coating 20 is dry, a positive transparency film 21 which is designed to mask the circuit pattern area is superimposed, as is shown in FIG. 23, upon the coating 20 which is now exposed to an arc light for an appropriate length of time. The positive transparency film 21 is then removed and the photosensitive, acid-soluble coating 20 is developed in hot water. This removes the portions of the coating 20 that were shielded from the arc light by the circuit pattern on the positive transparency film 21. Accordingly, the assembly will now have an appearance that is represented in FIG. 24 wherein it can be seen that the top of the copper plating 7 of the metallic circuit pattern is uncovered while the surface 2 of the carrier plate 1 is protected by a mask constituted by the photographically exposed portions of the coating 20.

A suitable bonding agent which may be the same adhesive mixture of polyvinyl butyral and phenolic resins that was used in the second process described above is now sprayed or brushed in liquid form over the uncovered copper surface 7 of the metallic circuit pattern until a coating 22 having the desired thickness is obtained, as is shown in FIG. 25. After driving the solvents from the adhesive coating 22 in any convenient manner known to those skilled in the art, the assembly is immersed in dilute acetic acid at room temperature in order to loosen the acid-soluble coating 20 so that it may be brushed away, thereby removing any of the adhesive 22 which may have been spilled on its surface. This uncovers the polished surface 2 of the carrier plate 1 and leaves it in a clean condition and completely free of the adhesive 22. Since the adhesive coating 22 is not affected by the dilute acetic acid, it will remain on top of the copper plating 7 of the metallic circuit pattern as is indicated in FIG. 26.

The next step in this third process is to mold an insulating base over the adhesive-coated metalic circuit pattern. This can be convenienty accomplished by following the steps of the second process that were described above with respect to FIGS. 17 and 18 and which comprise the application of a thin pile-up 14 of melamine resin-impregnated paper followed by a thick pile-up 15 of phenolic resin-impregnated paper. If desired, in order to insure the avoidance of planar distortion, a symmetrically balanced assembly may be formed in the manner described above with respect to FIG. 19. The assembly is now molded and cured in the manner described above so as to provide a hard, solid, insulating base similar to the base 19 that is shown in FIG. 20.

Finally, the Phosphor bronze material is removed in any suitable manner, such as by dissolving it in a solution of chromic and sulphuric acids as was described above so that the completed commutator switch plate will now appear in the form shown in FIG. 21. It is to be noted that, during the molding and curing operation, the polyvinyl butyral-phenolic adhesive coating 22 provides a secure bond between the metallic circuit pattern and the insulating base 19 as was explained above in the description of the second process. This results in the production of a commutator switch plate having unusually high peel strength so that its electrically conductive segments will resist loosening by long-term aging and will also remain intact and undisturbed after long periods of high-speed wiping.

The above-described alternative processes for fabricating flush-mounted printed circuits have been presented in order to explain the principles and features of this invention. It is to be understood that the invention is not limited to the fabrication of an assembly having a printed circuit on only one side thereof, as the above-described processes may be employed in the fabrication of an assembly having a printed circuit on more than one of its sides. This can be accomplished conveniently, for example, by substituting in place of the balance plate 18, that is shown in FIG. 19, another carrier plate having electroplated thereon another metallic circuit pattern. Accordingly, it is to be further understood that other modifications may be made in the processes described above without departing from the scope of the invention.

What is claimed is:

1. The process of fabricating a printed electric circuit having electrically conductive material flush-mounted in an insulating base, said process comprising the steps of delineating a circuit pattern upon a highly polished surface of a temporary carrier member, applying a coating of electrically conductive rhodium to the area of said circuit pattern delineated on said surface, electroplating a first backing member of nickel to said rhodium, electroplating a second backing member of copper to said nickel backing member, covering only said copper backing member with adhesive material, molding a hard solid base of insulating material to said surface of said carrier member and to said rhodium, and said first and second backing members while using said adhesive material as a bonding agent, and chemically removing said carrier member from both said molded insulating base and said rhodium and said first and second backing members by dissolving it with a solvent for said carrier member which is substantially inert toward said electrically conductive material and said insulating material.

2. The process of fabricating a printed electric circuit in accordance with claim 1, said process including for the purpose of keeping said adhesive off said surface of said carrier member and for limiting the application of said adhesive to only said second backing member the steps of covering both said carrier member and also said second backing member with an acid-soluble photosensitive material, printing photographically a duplicate of said circuit pattern upon said acid-soluble coating, and chemically removing only those portions of said acid-soluble coating which correspond to said circuit pattern thereby uncovering said second backing member while leaving the other portions of said acid soluble coating adhering only to said carrier member, said process also including the step of chemically removing the remaining portions of said acid-soluble coating by dissolving them in a suitable acid solution after the above-mentioned application of said adhesive to said second backing member, said acid solution being substantially inert towards the other components of the assembly.

3. The process of fabricating a printed electric circuit in accordance with claim 1, said process including for the purpose of avoiding planar distortion of said molded insulating base the steps of laying a plurality of sheets of uncured melamine resin-impregnated paper over said adhesive-covered metallic coating, superimposing a plurality of sheets of uncured phenolic resin-impregnated paper over said melamine paper, laying over said phenolic paper an amount of melamine paper equal to that which is under said phenolic paper, applying to said last-mentioned layer of melamine paper an amount of adhesive equal in quantity and composition to that applied to said metallic coating, and laying over said last-applied adhesive a temporary top member having the same composition and dimensions as said temporary carrier member said process further including after said insulating material has been molded into a hard solid insulating base the step of chemically removing said temporary top member from said molded insulating base simultaneously with the above-mentioned removal therefrom of said temporary carrier made by said solvent.

References Cited in the file of this patent

UNITED STATES PATENTS

| | | |
|---|---|---|
| 1,963,834 | Decker | June 19, 1934 |
| 2,251,965 | Verkinderen | Aug. 12, 1941 |
| 2,568,208 | Von Fraunhoter | Sept. 18, 1951 |
| 2,600,343 | Tuttle | June 10, 1952 |
| 2,692,190 | Pritikin | Oct. 19, 1954 |
| 2,695,351 | Beck | Nov. 23, 1954 |
| 2,702,252 | Suchoff | Feb. 15, 1955 |
| 2,724,674 | Pritikin | Nov. 22, 1955 |
| 2,961,746 | Lyman | Nov. 29, 1960 |

OTHER REFERENCES

Eisler: The Technological Printed Circuit, 1959, Heyword & Co., Ltd., London, pages 115–116.

Swiggett: "Introduction to Printed Circuits," Rider Pub. Inc., N.Y., N.Y., 1956, pages 56–57.

Schumpelt: "The Electrochemical Society," vol. 80, 1941, pp. 489–498.